United States Patent
Sullivan et al.

[11] Patent Number: 6,110,337
[45] Date of Patent: Aug. 29, 2000

[54] SPUTTERING METHOD AND APPARATUS WITH OPTICAL MONITORING

[75] Inventors: Brian T. Sullivan, Gloucester; Glenn A. Clarke; Norman Osborne, both of Ottawa, all of Canada

[73] Assignee: National Research Council of Canada, Ottawa, Canada

[21] Appl. No.: 09/200,920

[22] Filed: Nov. 30, 1998

[30] Foreign Application Priority Data

Dec. 1, 1997 [GB] United Kingdom ............. 9725356

[51] Int. Cl.$^7$ ..................................... C23C 14/34
[52] U.S. Cl. ......................... 204/298.26; 204/298.03
[58] Field of Search ................. 204/192.1, 192.12, 204/192.13, 298.03, 298.16, 298.19, 298.02, 192.33, 298.26; 219/121.77; 128/897; 427/585

[56] References Cited

U.S. PATENT DOCUMENTS

| | | |
|---|---|---|
| 4,288,307 | 9/1981 | Kiyotaka Wasa . |
| 4,336,119 | 6/1982 | Gillery ........................ 204/192.13 |
| 4,676,883 | 6/1987 | Nelson et al. . |
| 4,951,663 | 8/1990 | L'Esperance, Jr. ............. 128/897 |
| 4,975,168 | 12/1990 | Ichiro Ohno et al. . |
| 5,002,631 | 3/1991 | Giapis et al. ................. 204/192.33 |
| 5,154,810 | 10/1992 | Kamerling et al. ............ 204/192.13 |
| 5,403,433 | 4/1995 | Morrison et al. .............. 204/192.13 |
| 5,490,912 | 2/1996 | Warner et al. ................. 204/192.1 |
| 5,766,426 | 6/1998 | Clarke .......................... 204/192.13 |
| 5,822,211 | 10/1998 | Barenboim et al. ............ 219/121.77 |

FOREIGN PATENT DOCUMENTS

| | | |
|---|---|---|
| 0 190 051 | 8/1986 | European Pat. Off. .......... 204/298.02 |
| 0 666 337 | 8/1995 | European Pat. Off. . |

OTHER PUBLICATIONS

D.A. Walsh, et al.; "Optical thickness monitor for sputtered films"; Rev. Sci. Instrum., vol. 47, No. 8; pp. 932–934, Aug. 1976.

*Primary Examiner*—Nam Nguyen
*Assistant Examiner*—Gregg Cantelmo
*Attorney, Agent, or Firm*—Marks & Clerk

[57] ABSTRACT

In a method of sputtering thin films onto a substrate, the substrate is placed below a sputtering source assembly in a vacuum chamber. A light beam is projected onto the substrate and passes through an optical passage in the sputtering source assembly. In this way, the growth of the sputtered film can be accurately monitored at near normal angles of incidence.

6 Claims, 6 Drawing Sheets

SPUTTERING METHOD AND APPARATUS WITH OPTICAL MONITORING

FIELD OF THE INVENTION

This invention relates to the field of sputtering, and in particular to a method and apparatus for sputtering thin films onto a substrate offering a high degree of control over the sputtering process.

BACKGROUND OF THE INVENTION

Sputtering is a process where a target, for example, tantalum or silicon, is bombarded with ions in a vacuum chamber. This bombardment causes atoms to be ejected from the surface of the target, which are then deposited as a thin film on a substrate. In the case of optically transparent films, a reactive gas, such as oxygen or nitrogen, may also be present. These reactive gases can then form oxide or nitride thin films on a substrate. In the design of optical multilayer coatings, it is very important to be able to control precisely the thickness of the deposited films.

The customary way of monitoring film thickness is to pass a light beam through the growing film and measure the changes in transmissivity or reflectivity mainly due to optical interference effects. With a knowledge of the relevant optical constants, the thickness of the film can be calculated. Unfortunately, in conventional magnetron sputtering the substrate must be placed close to the sputtering target in order to maximize the deposition rate and the thickness uniformity. This distance is typically in the order of 10 to 20 centimeters.

Because of the proximity of the substrate to the sputtering target, it is very difficult to perform any kind of optical monitoring except at an oblique angle of incidence. This causes the beam spot to spread over a large area and makes the beam very sensitive to wobble.

The only way of monitoring the growth of a film at near normal angles of incidence is to increase the target-to-substrate distance and spatially offset the substrate from the target so as to allow light to pass through the substrate. Unfortunately, moving the substrate away from the sputtering target significantly lowers the deposition rate, and more importantly can degrade the microstructure of the deposited film as the bombardment becomes less energetic.

It is theoretically possible to employ reflection-based optical monitoring at an oblique angle of incidence. Polarization effects, however, become important for angles of incidence greater than about 15 degrees, which makes this technique more difficult to implement.

The above limitations have made it impossible, or at least very difficult, to make certain coatings. For example, some quarter wave based coatings cannot be accurately deposited by sputtering without continuous optical monitoring.

Another requirement for optical monitoring is that the beam alignment be maintained with a high degree of precision. There may be considerable movement of the components of the sputtering chamber due to thermal expansion and pressure changes, and it is important that the beam strike the film and detector in the same location on the film during the entire deposition run to avoid systematic monitoring errors.

An object of the invention is to alleviate this problem.

SUMMARY OF THE INVENTION

According to the present invention there is provided a method of sputtering thin films onto a substrate, comprising the steps of placing a substrate in the vicinity of a sputtering source assembly in a vacuum chamber, and monitoring the growth of a film on the substrate by projecting a light beam onto the film at near normal angles of incidence, said light beam passing through an optical passage in the sputtering source assembly.

By passing the light, normally a single wavelength beam, i.e., from a laser, but also optionally a white light beam through the sputtering target, the limitations of the prior art are overcome. It is possible to optically monitor the growth of the sputtered film continuously at near normal angles of incidence. As a result, it becomes possible to fabricate complex coatings by sputtering, such as quarterwave multilayer coatings, that cannot be made without using continuous optical monitoring techniques.

By near normal angles of incidence is meant the fact that the light beam travels essentially perpendicular to the substrate surface within the tolerance permitted by the measurement requirements, and generally such that polarization effects are not significant. Such angles, typically less than ±15° from true normal, are not achievable when the light beam is directed at the substrate from the side of the source. The term near normal is obviously intended to include precisely normal.

It should be understood that the reference to the term "light" does not restrict the invention to visible light. Any wavelength suitable for monitoring film thickness can be employed.

The beam can be passed through the film between diametrically opposed windows in the vacuum chamber. Various alternative arrangements are possible. For example, the light beam detector can be placed in the chamber behind the substrate. Or the beam can be collected behind the substrate with an optic fiber or fiber bundle, which can be led to a detection system outside the chamber. The detection system may include a detector, for example, a photodiode detector, and possibly optical lenses, fibers, monochromators, and filters.

Another option is to reflect a light beam off the front surface of the substrate, in which case the light beam can pass down through the optical passage and then be reflected back up to a detector adjacent the light source.

In another embodiment, an optic fiber or optic fiber bundle can be used to provide a light source on the back side of the substrate, in which case the detector can be outside the sputtering source so that the light passes from the substrate through the optical passage to the detector.

The invention also provides a sputtering source assembly comprising at least one sputtering target adapted to be placed in close proximity to a workpiece, and an optical passage provided through said sputtering source assembly to permit the passage of a monitoring light beam directed onto said workpiece at near normal angles of incidence.

The invention still further provides sputtering apparatus comprising a vacuum chamber, a sputtering source assembly mounted on said vacuum chamber, a substrate support locatable in the vicinity of said sputtering source assembly, and an optical passage through said sputtering source assembly to permit the passage of a light beam projected onto said substrate at near normal angles of incidence.

BRIEF DESCRIPTION OF THE DRAWINGS

The invention will now be described in more detail, by way of example only, with reference to the accompanying drawings, in which.

DESCRIPTION OF THE PREFERRED EMBODIMENTS

Figure 1:
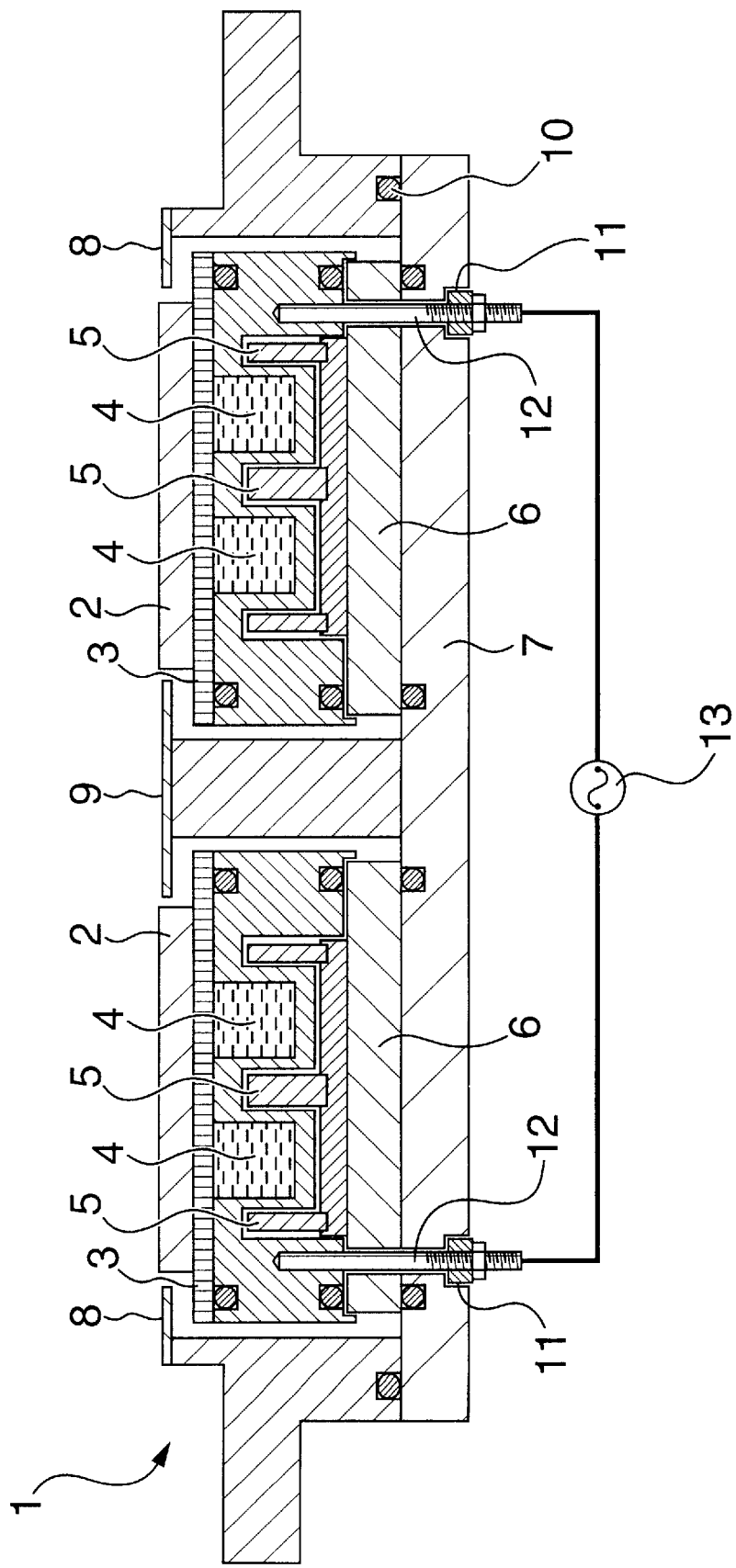
FIG. 1 is a cross-sectional view of a conventional dual magnetron sputtering source.
Figure 2:
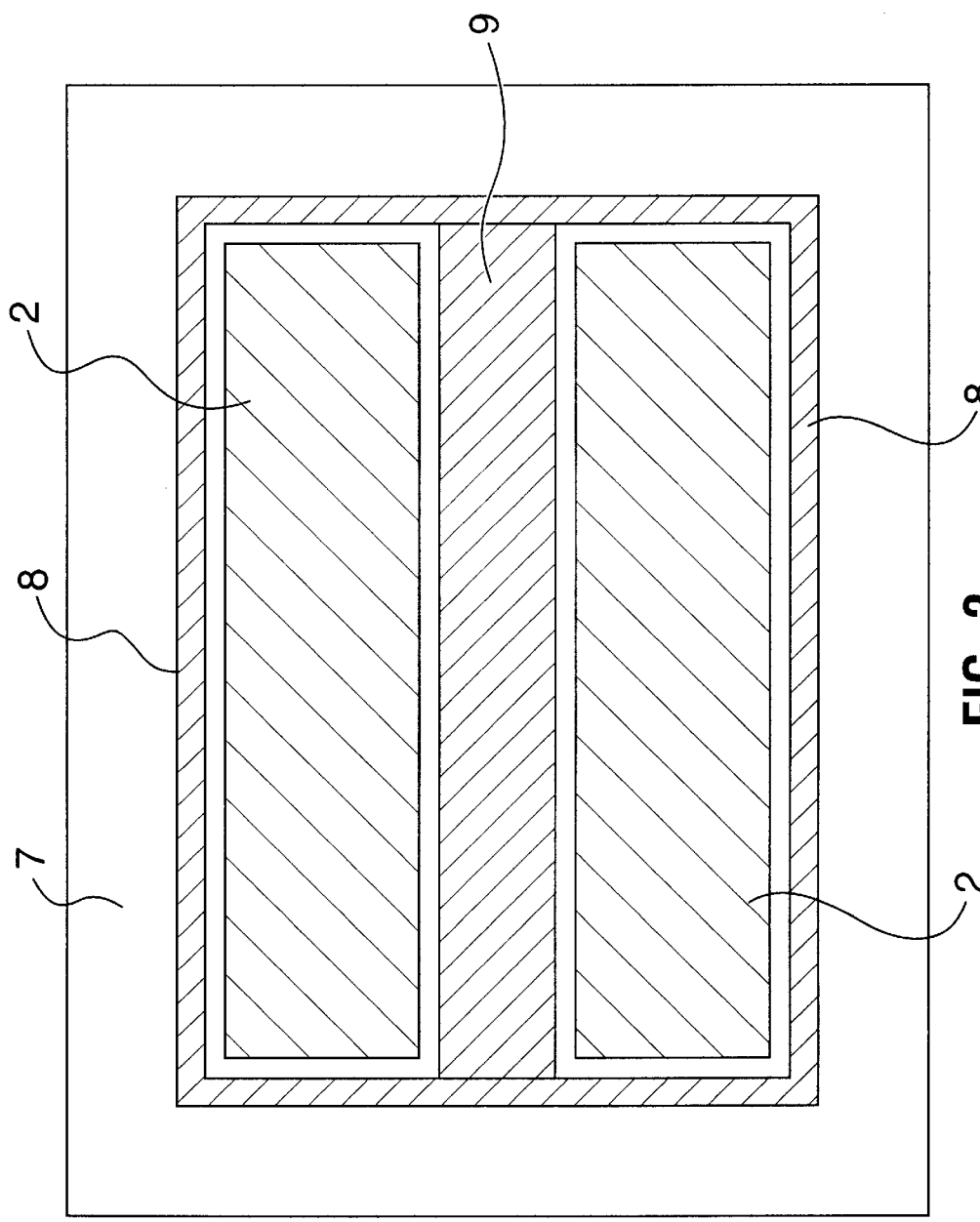
FIG. 2 is a plan view of the active side of the conventional sputtering source.

Referring now to FIGS. 1 and 2, the conventional dual magnetron sputtering source assembly 1 sealingly and removably mounted on an external port 50 comprises a pair of sputtering targets 2 located on copper plates 3 mounted in an assembly consisting of cooling water channels 4, magnets 5, insulating plates 6, and base plate 7 in a manner known per se. The plates 3 can be made of any other suitable material.

A protective ground shield 8 surrounds the targets 1, and a central portion 9 extends around and between the targets 1. The ground shield 8 is mounted on and electrically connected to the base plate 7.

O-ring seals 10 seal the assembly. Feedthroughs 11 provide access for electrodes 12 connected to ac source 13.

The sputtering source described so far is conventional and could, for example, be a Dual Magnetron Sputtering Source manufactured by Shincron Co. Ltd., Japan.

Figure 3:
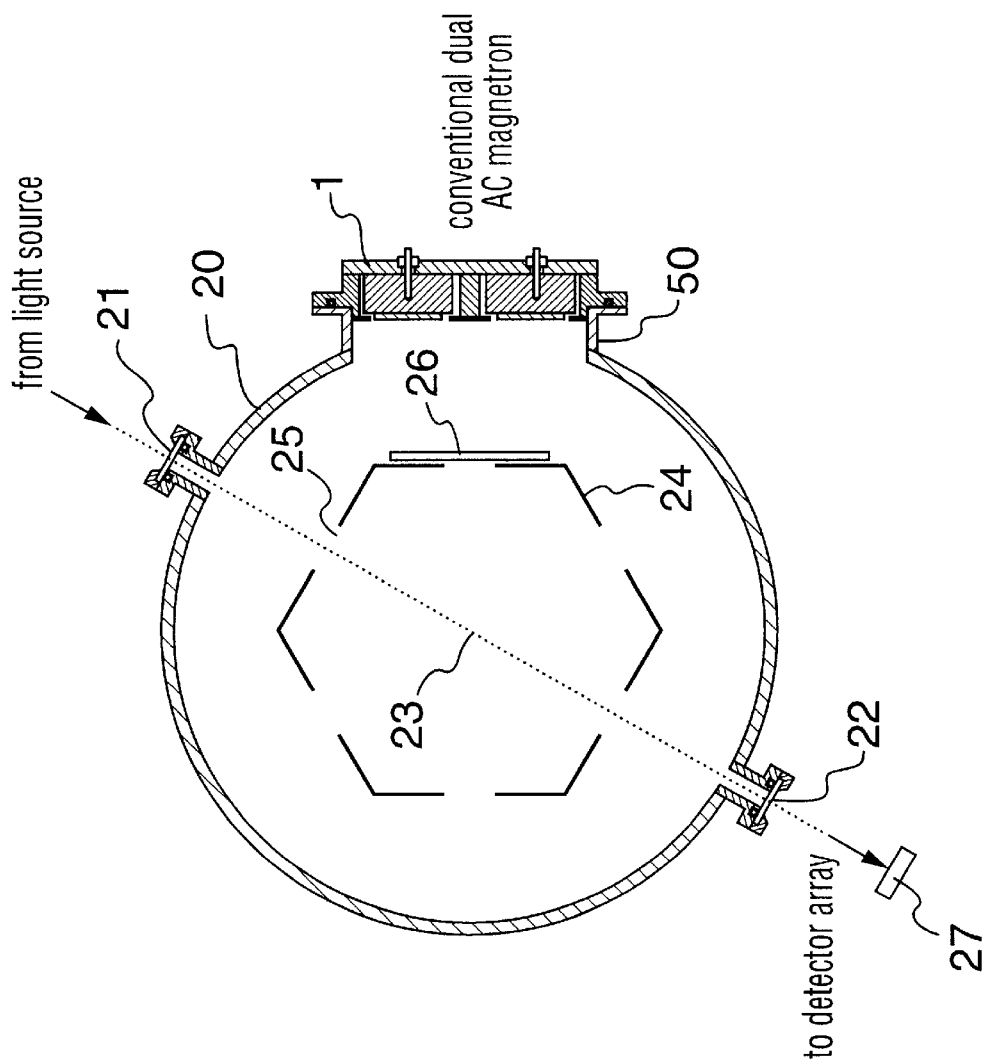
FIG. 3 is a cross-sectional view of a conventional sputtering chamber with optical monitor.

As shown in FIG. 3, the assembly 1 is mounted on the port 50 in the wall of a vacuum chamber, which also has diametrically opposed windows 21, 22 through which is passed a light beam 23. This can be single wavelength, i.e. a laser beam, but it also be, for example, a white light beam. If a broadband source, such as a white light beam is employed, the light passing through the substrate can be collected and passed through a monochromator, which filters out one or more wavelengths of interest. Collimating optics (not shown) are required to form the light into a collimated beam.

A rotatable hexagonal turret support 24 with apertures 25 on which can be mounted a substrate 26 is placed inside the chamber in a known manner. The support 24 can be rotated to bring the substrate 26 into opposition with the sputtering source assembly 1 for sputtering deposition. Additional, circumferentially offset sources can be provided in the chamber to allow a series of films of different composition to be deposited. Typically, in the fabrication of optical filters, alternate high and low refractive index layers are deposited.

As discussed above, with a dual magnetron assembly the substrate must be within 10 to 20 cms of the sputtering source, which makes it impractical to continuously optically monitor the growing film at near normal angles of incidence due to the presence of the magnet assemblies, water cooling lines and the like. In this embodiment, in order to measure the film properties, the substrate 26 must therefore be rotated from time to time into the light beam 23 for measurements to be taken with the aid of detector 27, away from the sputtering source, whereupon the substrate is then rotated back to the position in front of the sputtering source until the desired film thickness has been achieved. This is undesirable because it is not possible to optically monitor the film thickness continuously while it is actually growing on the substrate, making it impossible to provide precise monitoring and controlled growth.

Figure 4:
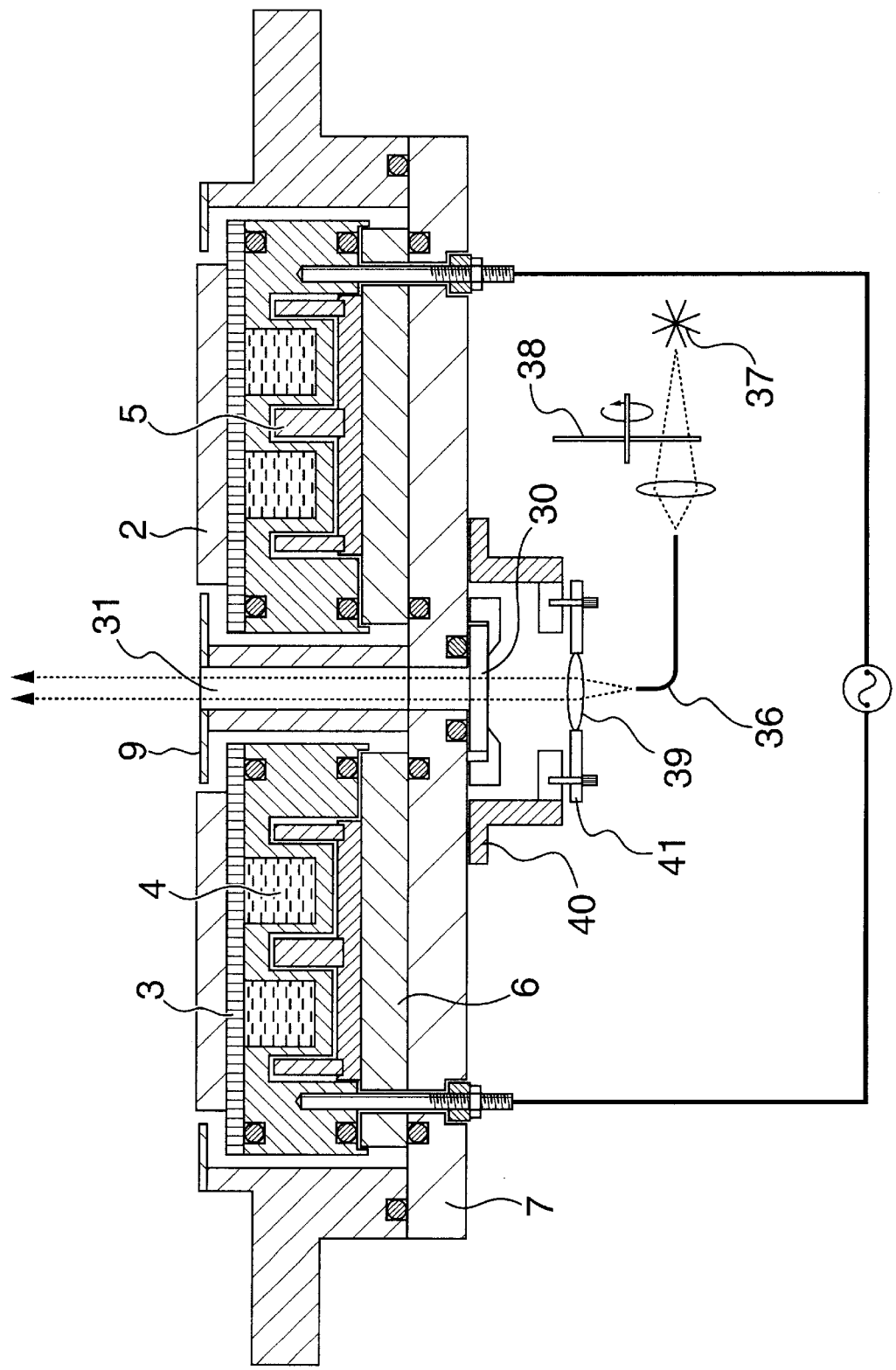
FIG. 4 is a cross-sectional view of a dual magnetron sputtering source modified in accordance with the invention.
Figure 5:
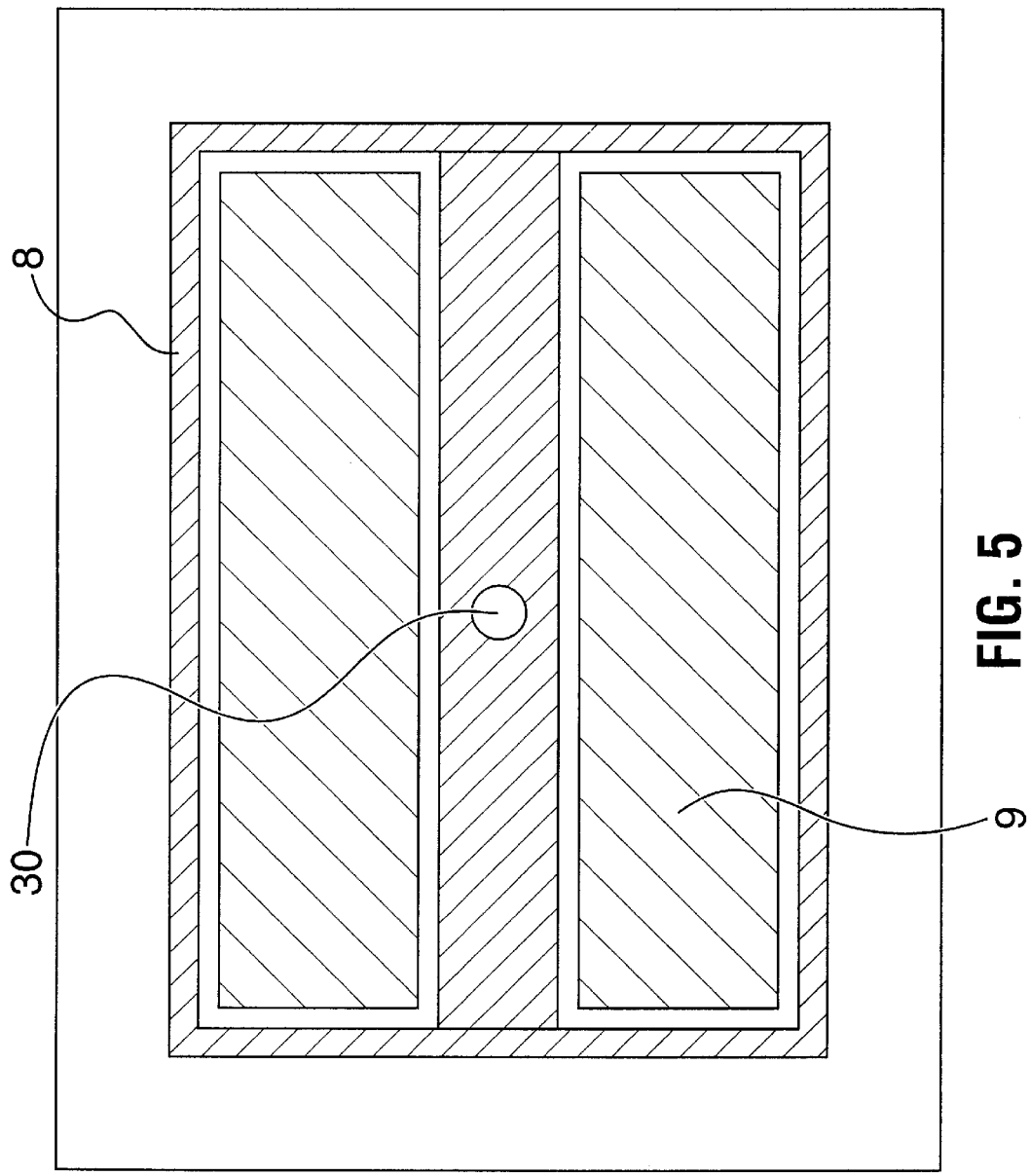
FIG. 5 is a plan view of the active side of a sputtering source modified in accordance with the invention.

In the embodiment shown in FIGS. 4 and 5, the sputtering source assembly 1 is modified to provide an optical passage 31 through the central portion 9 of the ground plate 8 and the base plate 7. The optical passage must be capable of permitting the passage of a light beam. It can be simply a central bore with a window 30, or it could be, for example, an optic fiber bundle and associated collimating optics, capable of carrying the light beam. For example, an optic fiber or optic fiber bundle could pass through a vacuum feedthrough into the optical passage 31 and terminate short of the central portion 9 of the ground plate 8. A collimating lens could be provided at the end of the optic fiber, recessed in the passage 31 to keep it clear of the sputtering region around the targets.

In one embodiment, light from light source 37 is passed through a mechanical chopper 38 to pulse the beam at a known frequency. This enables a locking-amplifier to lock on to the collected light and separate it from the ambient light in the vacuum chamber. The light is then fed into optic fiber 36 and passed to collimating lens 39 mounted on a tilt stage 41, which in turn is mounted on a rigid frame attached to based plate 7. The collimating lens forms beam 23, which is directed into the chamber through window 31.

The tilt stage 41, which is a Newport LP-05 5-axis gimbal optic mount, permits x, y, z, axis translation, and $\theta_x$, $\theta_y$ rotation. This permits the beam to be very precisely aligned before it enters the vacuum chamber 20.

Figure 6:
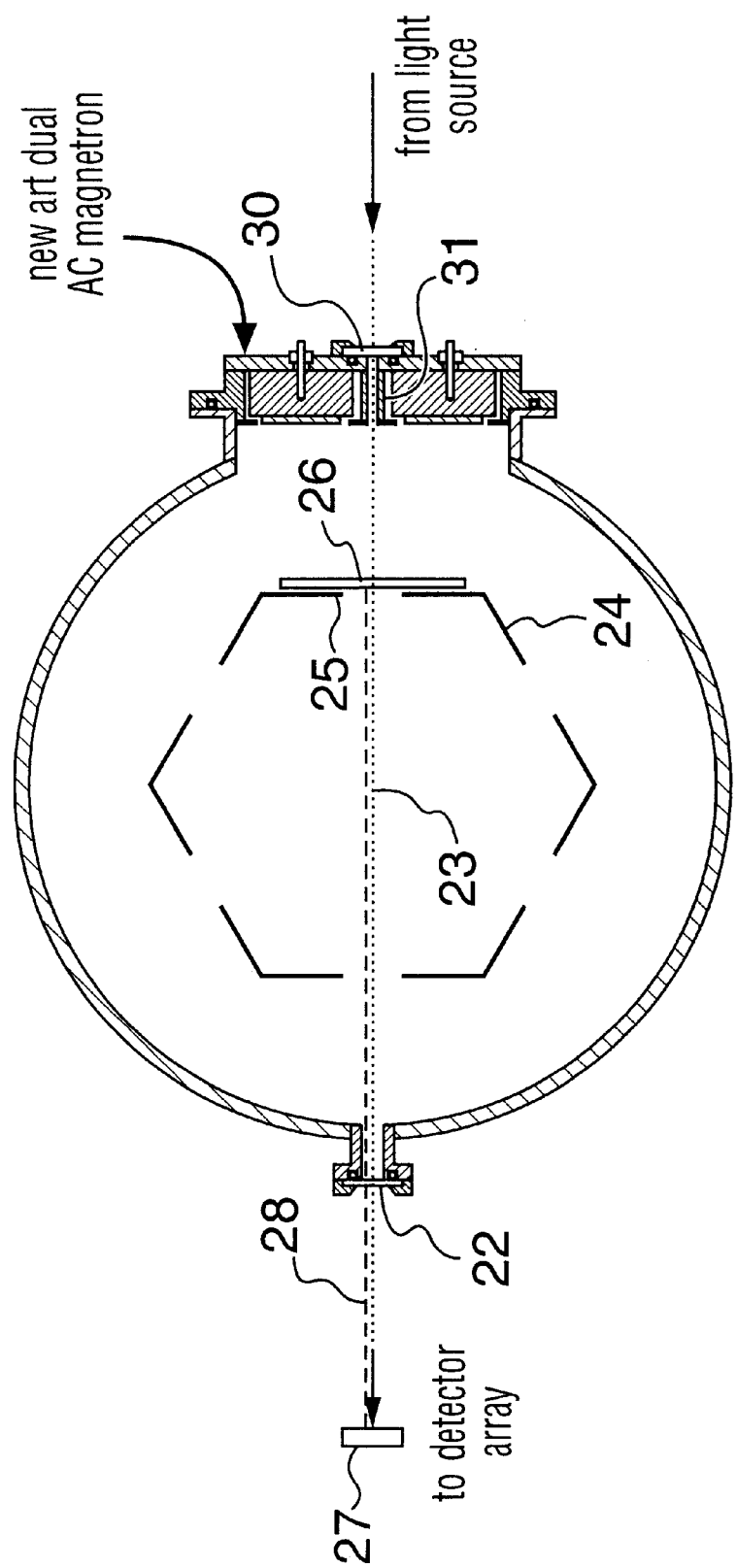
FIG. 6 is a cross-sectional view of a modified sputtering chamber.

As shown in FIG. 6, it is no longer necessary during the sputtering process to rotate the substrate support in order to make a transmittance or reflectance thickness measurement at near normal angles of incidence. The light beam 23 is passed directly through the substrate 26 at a near normal angle of incidence as the film is being grown. The light beam passes out of the chamber 20 through window 22 in the wall of the vacuum chamber to detector 27, which measures the transmissivity of the substrate 26. This changes as the film grows due to interference and/or absorption effects. The thickness of the film can be calculated from a knowledge of the relevant optical constants by conventional techniques. In an alternative embodiment, an optic fiber bundle represented by dashed line 23 can lead the light from behind the substrate 26 to detector 27.

The design of a dual target source is particularly well suited to the provision of optical passage 31 because the central plate through which the passage is bored is at ground potential, so no special measures have to be taken to deal with high voltages. The targets typically operate at around 600 Volts.

A locking-amplifier (not shown) that locks onto the chopping frequency distinguishes the light from the light source from the ambient light generated by the plasma in the chamber. Also, if the source 37 is a broadband source, a monochromator upstream of the detector can separate out one or more wavelengths of interest.

Using this system accurate measurements of film thickness can be made continually during the sputtering process. As a result it is now possible to make quarterwave-based filters by sputtering, with the substrate close to the sputter source, using quarterwave monitoring.

It is important in the invention that the monitoring light beam strike the substrate at a near normal angle of incidence. One way of achieving this result is to pass the light through the windows 30, 22 and the central bore 30 as shown in FIG. 6.

Another solution is to perform reflectance monitoring by placing the detection system 27 adjacent the light source, offset by 2 or 3° in front of the window 30 so that a beam is directed into the chamber 20 through optical passage 31, and reflected off the substrate back through passage 31 to the detection system or fiber adjacent the source. Another solution is either to place the detector inside the chamber 20 behind the substrate 26, or alternatively to place a bundle of optic fibers behind the substrate 26 and lead the light out through the optic fiber bundle to a detector outside the chamber.

Another option is to place the light source behind the substrate 26 in the chamber and monitor the light transmitted through the substrate 26 and passing out through optical passage 30 by placing a detection system or fiber in front of the sputtering source 1 outside the chamber. In this case the detector could be placed on the tilt stage 41 so as to achieve alignment with the source. An advantage of the latter arrangement is consistency between sputtering targets. Optical filters are made by depositing alternate layers of low and high refractive index material on the substrate. To achieve this, the support 24 is rotated to bring the substrate 26 in front of different sputtering sources. When a back side light source is used, the light source does not move relative to the substrate between depositions, and as a result it is possible to achieve greater consistency and, hence, accuracy, in monitoring the different layers.

If desired, anti-reflective coatings can be provided on the window 30 on the optical passage 31 in order to increase the amount of light entering the chamber.

The passage 31 can be a simple bore, or alternatively it could be provided by a bundle of optic fibers with associated collimating optics located in the passage 31 inside the chamber.

The invention thus represents an important advance in the art. The ability to perform continuous monitoring at near normal angles of incidence permits a degree of control over the sputtering process not possible in the prior art. This results in the fabrication of improved optical devices, such as narrowband filters.

What is claimed is:

1. Sputtering apparatus comprising:

a vacuum chamber having an external port;

a dual magnetron sputtering source assembly sealingly and removably mounted on said external port, said sputtering source assembly having a pair of targets in said vacuum chamber, said targets being surrounded by a ground plate with a central portion of said ground plate extending between said targets;

a substrate support positioned opposite said sputtering source assembly in said vacuum chamber and having an aperture therein; and an optical passage extending through said sputtering source assembly and being bored through said central portion of said ground plate between said targets to permit the passage of a light beam projected onto a substrate on said substrate support at near normal angles of incidence;

a light source for producing said light beam; and a detector for detecting said light beam after said light beam has passed through said substrate at a near normal angle of incidence.

2. Sputtering apparatus as claimed in claim 1, wherein said light source is positioned in front of said optical passage so as to project said beam through said substrate to said detector, which is located behind said substrate support.

3. Sputtering apparatus as claimed in claim 2, wherein said detector is positioned outside said vacuum chamber, and a window is provided in a wall of said vacuum chamber opposite said optical passage for said light beam to pass through.

4. Sputtering apparatus as claimed in claim 2, wherein said detector is positioned outside said vacuum chamber, and an optic fiber bundle behind said substrate leads said light beam to said detector.

5. Sputtering apparatus as claimed in claim 1, wherein said light source comprises an optic fiber located behind said substrate support to project said light beam through said substrate into said optical passage and to a detector located outside said vacuum chamber.

6. Sputtering apparatus as claimed in claim 1 further comprising a tilt stage mounted over said optical passage outside said vacuum chamber for mounting said light beam source and permitting precise alignment of said light beam.

* * * * *